United States Patent
Baird et al.

(10) Patent No.: US 7,288,820 B2
(45) Date of Patent: Oct. 30, 2007

(54) LOW VOLTAGE NMOS-BASED ELECTROSTATIC DISCHARGE CLAMP

(75) Inventors: Michael Baird, Chandler, AZ (US); Richard T. Ida, Chandler, AZ (US); James D. Whitfield, Gilbert, AZ (US); Hongzhong Xu, Gilbert, AZ (US); Sopan Joshi, Urbana, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 4 days.

(21) Appl. No.: 11/000,584

(22) Filed: Dec. 1, 2004

(65) Prior Publication Data

US 2005/0093073 A1 May 5, 2005

Related U.S. Application Data

(62) Division of application No. 10/361,469, filed on Feb. 10, 2003, now Pat. No. 6,844,597.

(51) Int. Cl.
*H01L 23/62* (2006.01)

(52) U.S. Cl. .................. 257/355; 257/358; 257/360

(58) Field of Classification Search ........ 257/355–360, 257/546
See application file for complete search history.

(56) References Cited

U.S. PATENT DOCUMENTS

| | | | | |
|---|---|---|---|---|
| 5,563,525 A | * | 10/1996 | Lee | 326/30 |
| 5,686,751 A | * | 11/1997 | Wu | 257/356 |
| 6,291,862 B1 | | 9/2001 | Chevallier | 257/392 |
| 6,329,692 B1 | | 12/2001 | Smith | 257/360 |

OTHER PUBLICATIONS

Joshi et al., "ESD protection form BiCMOS circuits," *IEEE BCTM Proceedings*, 12.5: 218-221, 2000.

* cited by examiner

*Primary Examiner*—Hoai Pham
(74) *Attorney, Agent, or Firm*—Fulbright & Jaworski

(57) ABSTRACT

Systems and methods are described for a low-voltage electrostatic discharge clamp. A resistor pwell-tied transistor may be used as a low-voltage ESD clamp, where the body of the transistor is coupled to the source by a resistor, thereby reducing a DC leakage current and minimizing latch-ups in the transistor while maintaining effective ESD performance.

6 Claims, 2 Drawing Sheets

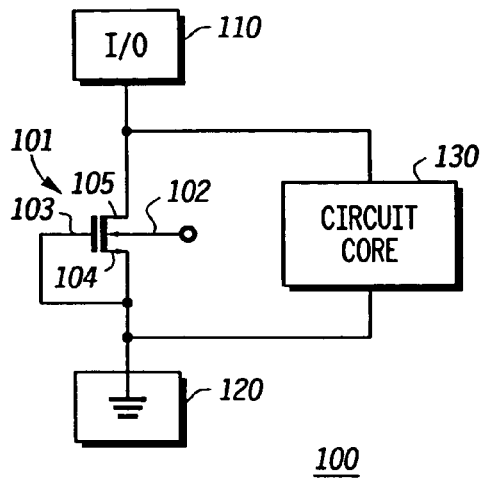
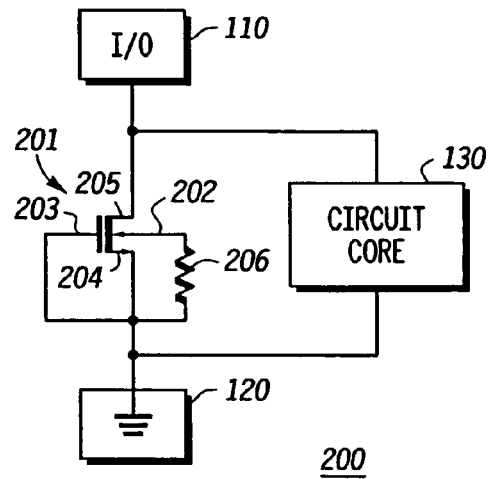
FIG.1
-PRIOR ART-
FIG.2
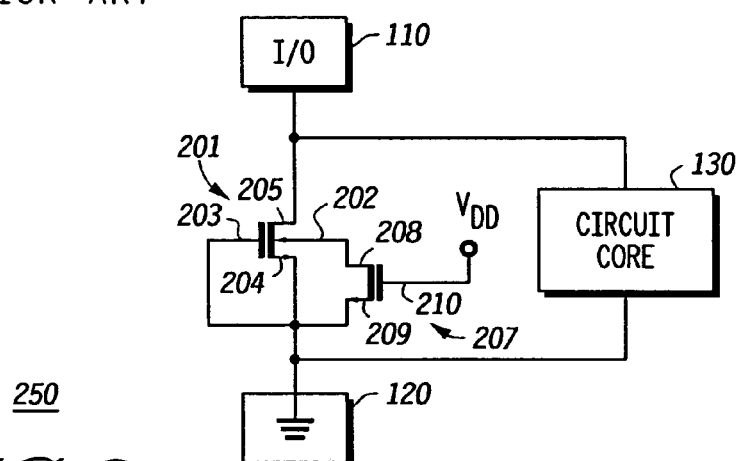
FIG.3
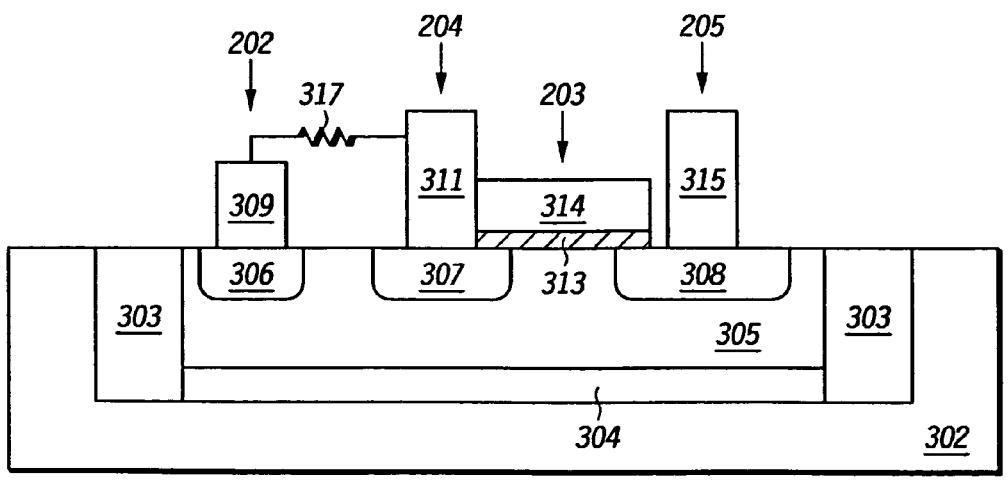
FIG.4

LOW VOLTAGE NMOS-BASED ELECTROSTATIC DISCHARGE CLAMP

This is a divisional of U.S. patent application Ser. No. 10/361,469, filed Feb. 10, 2003 now U.S. Pat. No. 6,844,597. The entire contents of the foregoing application are incorporated herein by reference.

BACKGROUND OF THE INVENTION

1. Field of the Invention

The invention relates generally to the field of semiconductors. More particularly, the invention relates to a low voltage electrostatic discharge clamp.

2. Discussion of the Related Art

Electrostatic discharge (ESD) is an important reliability concern for most classes of integrated circuits. In order to protect the circuit core, a circuit designer may use a protective element connected in parallel with the circuit, connecting an input/output (I/O) pad to the ground. However, providing an ESD protection element that is able to shunt high levels of ESD current while maintaining low clamping voltages, that uses a relatively small area, and that is compatible with exciting IC process technologies is particularly challenging.

An ESD protection element must provide a high level of protection with minimum parasitic loading area. Additionally, an ESD protection device is required to exhibit a failure current that is large and that properly scales with the area of the protection device itself.

An unsatisfactory approach to protecting a circuit from ESD includes utilizing a floating-body n-channel metal-oxide semiconductor (NMOS) device. Floating-body NMOS transistors may be used as ESD clamps and usually present good ESD protection. Nevertheless, problems with this technology include a high direct leakage current (DC leakage) and greater susceptibility to latch-up. In the case of an NMOS transistor, for example, DC leakage may be in the form of an undesirable current from the drain to the source. Latch-up may occur, for example, when the parasitic thyristor structures formed by the NMOS and adjacent devices are inadvertently triggered.

Thus, there is need for a device which presents good ESD protection characteristics with low DC leakage and high latch-up immunity.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals (if they occur in more than one view) designate the same or similar elements. The invention may be better understood by reference to one or more of these drawings in combination with the description presented herein. It should be noted that the features illustrated in the drawings are not necessarily drawn to scale.

FIG. 1 is a combination circuit and block diagram of a prior-art ESD protection system.

FIG. 2 is a combination circuit and block diagram of an ESD protection system, representing an embodiment of the invention.

FIG. 3 is a combination circuit and block diagram of another ESD protection system, representing an embodiment of the invention.

FIG. 4 is a cross-section of an isolated RPWT NMOS transistor, representing an embodiment of the invention.

DETAILED DESCRIPTION

Figure 5:
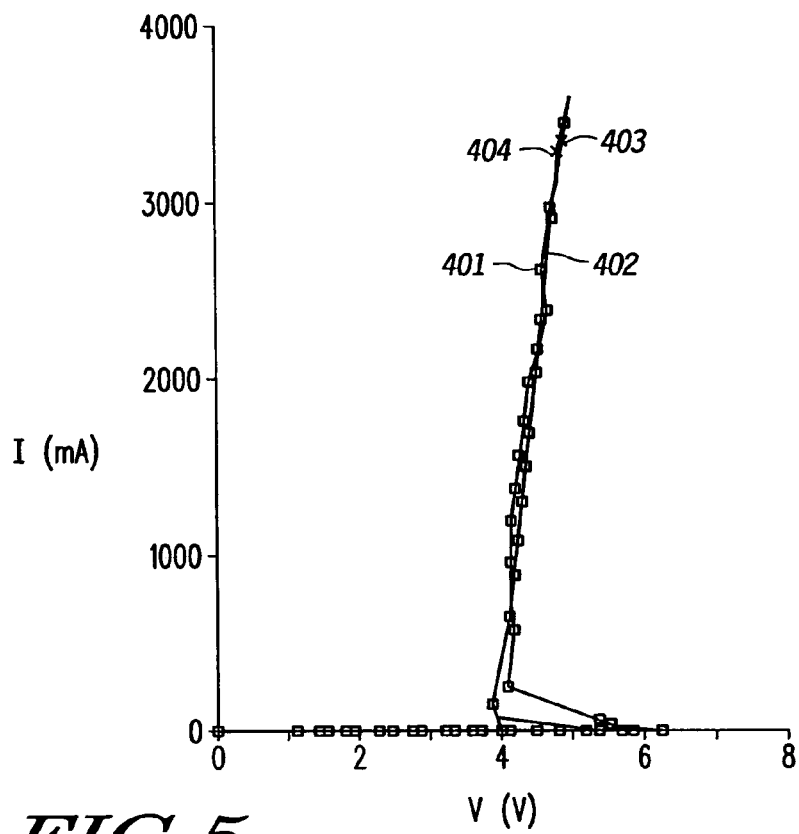
FIG. 5 is a graph of a transmission line pulse (TLP) curve 402 characteristic of an RPWT clamp such as the one detailed in FIG. 2 or 3 and of a TLP curve 401 characteristic of a prior-art clamp such as the one detailed in FIG. 1, illustrating one aspect of the invention.

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating specific embodiments of the invention, are given by way of illustration only and not by way of limitation. Various substitutions, modifications, additions and/or rearrangements within the spirit and/or scope of the underlying inventive concept will become apparent to one of ordinary skill in the art from this disclosure.

According to an aspect of the invention, a method includes protecting a circuit from an electrostatic discharge by coupling a resistor p-well connected transistor to an input/output pad and to a ground in parallel with the circuit.

According to another aspect of the invention, a resistor p-well connected transistor includes a substrate, an isolating structure in the substrate, an isolating layer adjacent to the isolating structure, a well adjacent to the isolating layer and the isolating structure, a first doped region in the well, a first conducting terminal adjacent to the first doped region defining a body, a second doped region in the well, a second conducting terminal adjacent to the second doped region defining a source, a dielectric layer adjacent to the well, a third conducting terminal adjacent to the dielectric layer defining a gate, a third doped region in the well, a fourth conducting terminal adjacent to the third doped region defining a drain, and a resistive element coupled between the first conducting terminal and the second conducting terminal.

Referring to FIG. 1, a combination circuit and block diagram of a prior-art ESD protection system 100 is depicted. A floating-body transistor (or clamp) 101, having a body 102, a gate 103, a source 104, and a drain 105 is connected to an I/O pad 110 via the drain 105, and to a ground 120 via the source 104. The gate 103 is connected to the source 104. A circuit or circuit core 130 is connected to the drain 105 and to the source 104, in parallel with the floating-body transistor 101.

The floating-body transistor 101 may be an n-channel metal-oxide semiconductor (NMOS) transistor, an isolated NMOS transistor, or the like. The body 102 is floating, that is, its terminal has an undefined voltage.

In operation, the floating-body transistor 101 may function as a clamp due to its parasitic lateral NPN characteristics. The floating-body transistor operates as bipolar junction transistor (BJT) in breakdown mode, which may typically handle large amounts of current with a low "on" resistance, thereby reducing the total power dissipation. Ideally, during an ESD event, the floating-body transistor 101 turns on (conducts) before the circuit 130 is damaged. The floating-body transistor 101 remains "off" (non-conducting) during normal circuit operation.

Referring to FIG. 2, a combination circuit and block diagram of an ESD protection system 200 is depicted according to an exemplary embodiment of the invention. An ESD protection transistor (or clamp) 201 having a body 202, a gate 203, a source 204, and a drain 205 is connected to the I/O pad 110 via the drain 205, and to a ground terminal 120 via the source 204. The gate 203 is connected to the source 204. The body 202 is coupled to the source 204 though a resistor 206. The circuit 130 is connected to the drain 205 and to the source 204, in parallel with the ESD protection transistor 201. In practice, the ESD protection transistor 201 may be "on-chip", meaning that it is formed on the same semiconductor substrate as circuit 130.

In one embodiment, the ESD clamp 201 may be a resistor p-well connected transistor 201, also referred to as a resistor p-well tied (RPWT) transistor 201. The RPWT transistor 201 may be a RPWT n-channel metal-oxide semiconductor (NMOS) transistor, an RPWT isolated NMOS transistor, or the like.

In another embodiment, the ESD clamp 201 may be a resistor n-well connected transistor 201. The resistor n-well connected transistor 201 may be a p-channel metal-oxide semiconductor (PMOS) transistor, an isolated PMOS transistor, of the like.

In operation, the RPWT transistor 201 can be viewed as an NPN junction transistor. When the parasitic lateral NPN process is "on", the drain 205 acts like a collector, the source 204 acts like an emitter, and the body 202 acts like a base, thereby effectively protecting the circuit 130. An ESD current passes through the RPWT transistor 201, flowing from the I/O pad 110 to the ground 120. The functioning of an NPN transistor is known to one of ordinary skill in the art. When the RPWT transistor 201 is "off", the resistor 206 may reduce a direct current leakage from the drain 205 to the source 204, and avoid latch-ups in RPWT transistor 201.

The invention may include connecting a resistive element between the body 202 and the source 204 of clamp 201. In one embodiment, resistor 206 may be used as the resistive element. In another embodiment, a transistor or a switch may be used as the resistive element.

Referring to FIG. 3, a combination circuit and block diagram of another ESD protection system 250 is depicted according to an exemplary embodiment of the invention. Switch 207 may be, for example, an NMOS transistor. In this embodiment, a switch drain 208 is connected to the body 202 of the ESD clamp 201, a switch source 209 is connected to the source 204 of the ESD clamp 201, and a switch gate 210 is connected to a voltage supply $V_{DD}$. In one embodiment, the voltage supply $V_{DD}$ is the same supply used by the circuit core 130.

In operation, when the voltage supply $V_{DD}$ is on, the switch 207 has a low resistance (on-state). When the voltage supply $V_{DD}$ is off, the switch 207 has a high resistance (off-state). Thus, the switch 207 effectively functions as a resistance when the power is off. As one of ordinary skill in the art will recognize in light of this disclosure, ESD events are more likely to occur when the power is off and the circuit is handled by human contact.

Referring to FIG. 4, a cross-section of an isolated RPWT NMOS transistor (or clamp) 300 is depicted according to an exemplary embodiment of the invention. A p-substrate 302 is adjacent to an n-well ring 303 and to a n-doped layer 304. The n-well ring 303 and the n-doped layer 304 isolate a p-well 305 from the p-substrate 302. A p+ region 306, a first n+ region 307, and a second n+ region 308 are adjacent to the p-well 305.

A first conducting terminal 309 is adjacent to the p+ region 306, defining the body 202. A second conducting terminal 311 is adjacent to the first n+ region 307, forming the source 204. The first conducting terminal 309 is coupled to the second conducting terminal 311 through a resistor 317. A dielectric layer 313 is adjacent to the p-well 305 and to the first and second n+ regions 307, 308. The dielectric layer 313 is also adjacent to a third conducting terminal 314, defining the gate 203. In one embodiment, the dielectric layer 313 may be a silicon dioxide layer ($SiO_2$). The third conducting terminal 314 is adjacent to the second conducting terminal 311, directly coupling the gate 203 to the source 204. A fourth conducting terminal 315 is adjacent to the second n+ region 308, defining a drain 205.

In one embodiment, the n-well ring 303 may be substituted by another isolating structure such as, for example, a deep trench isolating structure. In another embodiment, the first, second, third and fourth conducting terminals 309, 311, 314, 315 may be metal terminals, or may be made of any other conducting materials such as, for example, polysilicon.

The isolated RPWT NMOS transistor 300 may be used, for example, as the RPWT transistor 201 in the ESD protection system 200 depicted in FIG. 2. In one embodiment, the resistor 317 may be internal to the p-well 305.

When the isolated RPWT NMOS transistor 300 is "on", an electron avalanche is created at a reverse biased drain junction, a drifting of holes elevates the body potential, and the source diode is forward biased, thus making the source 204 act like an NPN emitter, the body 202 act like an NPN base, and the drain 205 act like an NPN colletor. When the RPWT NMOS transistor 300 is "off", the resistor 317 may reduce a DC leakage from the drain 205 to the source 204 and avoid latch-up.

Referring to FIG. 5, a transmission line pulse (TLP) curve 402 characteristic of an RPWT clamp such as the one detailed in FIG. 2 or 3 is compared to a TLP curve 401 characteristic of a prior-art clamp such as the one detailed in FIG. 1, illustrating one aspect of the invention. The vertical axis is the ESD current through an ESD protection device in milliamperes. The horizontal axis is the voltage across the device in volts.

Transmission line pulse testing is a well-known electrical analysis tool which mimics ESD events and may be used for ESD stress testing. A first cross 403 indicates the failure point of the RPWT clamp, while a second cross 404 indicates the failure point of the prior-art clamp. Curves 401, 402 are substantially similar, showing that the RPWT clamp disclosed herein achieves an ESD performance similar to that of the prior-art, floating-body clamp.

Figure 6:
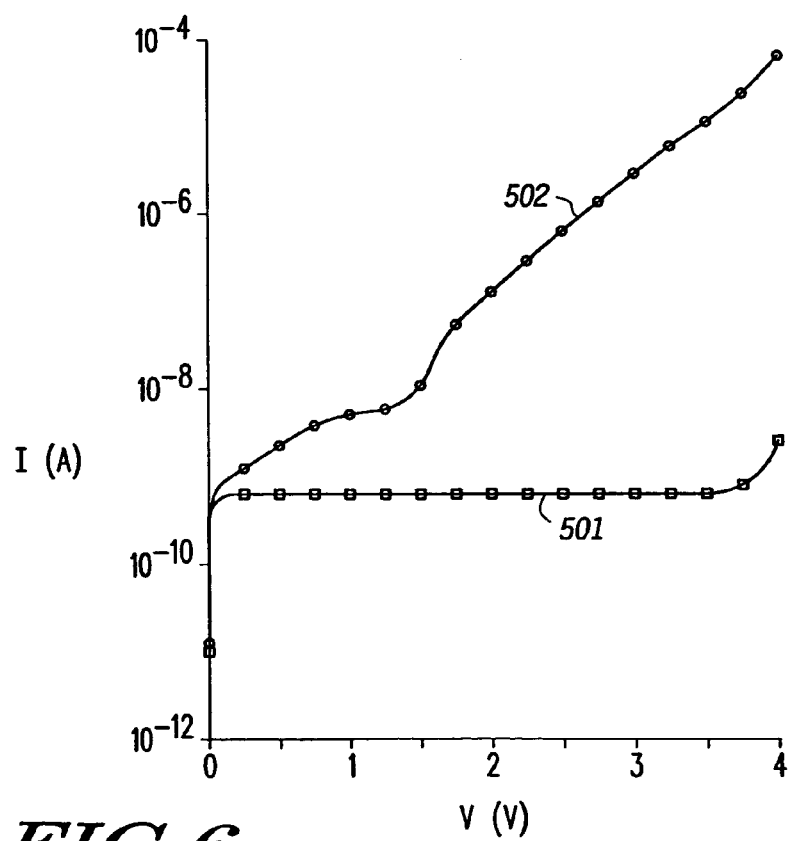
FIG. 6 is a graph of a direct leakage current (DC leakage) curve 501 characteristic of an RPWT clamp such as the one detailed in FIG. 2 or 3 and of a DC leakage curve 502 characteristic of a prior-art clamp such as the one detailed in FIG. 1, illustrating one aspect of the invention.

Referring to FIG. 6, a direct current (DC) leakage curve 501 (open circles) characteristic of an RPWT clamp such as the one detailed in FIG. 2 or 3 is compared to another DC leakage curve 502 (open squares) characteristic of a prior-art clamp such as the one detailed in FIG. 1, illustrating one aspect of the invention. The vertical axis is the DC leakage through an ESD protection device in amperes. The horizontal axis is the voltage across the device in volts.

Direct current leakage testing may be used to measure the current leaking from the drain to the source of a transistor when a DC voltage is applied from the drain to the source of the transistor. As FIG. 6 indicates, the DC leakage of the RPWT clamp 501 is significantly less than that of the prior-art, floating-body clamp 502, while maintaining equivalent ESD performance as shown in FIG. 5.

In another embodiment, the invention includes using another resistive element coupling the gate to the source of an RPWT transistor to produce a gate-coupling effect and further improve ESD protection. The invention may include an RPWT NMOS transistor made of a low-voltage junction isolated NMOS transistor with its body coupled to its source through a resistor. Further, the invention may include using the RPWT NMOS transistor to protect low-voltage MOS devices from ESD, while minimizing DC leakage and latch-ups.

The particular manufacturing process used for the RPWT transistor of the present invention is within the skill level of one of ordinary skill in the art and is not essential as long as it provides the described functionality. Normally those who make or use the invention may select the manufacturing process based upon tooling and energy requirements, the expected application requirements of the final product, and the demands of the overall manufacturing process, as known in the art.

The terms "a" or "an", as used herein, are defined as one or more than one unless the specification explicitly states otherwise. The term "substantially", as used herein, is defined as at least approaching a given state (e.g., preferably within 10% of, more preferably within 1% of, and most preferably within 0.1% of). The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

The appended claims are not to be interpreted as including means-plus-function limitations. Subgeneric embodiments of the invention are delineated by the appended independent claims and their equivalents. Specific embodiments of the invention are differentiated by the appended dependent claims and their equivalents.

What is claimed is:

1. An electrostatic protection circuit coupled to a circuit under protection, the electrostatic protection circuit comprising:
   at least two terminals including a first terminal coupled to an input/output pad and a second terminal coupled to a ground terminal;
   a resistor p-well connected transistor having a resistive element, a body, a drain, a gate, and a source, wherein:
      the drain is coupled to the input/output pad and to a first node of the circuit under protection;
      the source is coupled to the ground terminal and to a second node of the circuit under protection;
      the gate is coupled to the source; and
      the resistive element couples the body to the source.

2. The electrostatic protection circuit of claim 1, the resistive element comprising a resistor.

3. The electrostatic protection circuit of claim 1, the resistive element comprising a semiconductor switch configured as a resistor.

4. The electrostatic protection circuit of claim 3, the resistive element comprising a transistor configured as a resistor.

5. The electrostatic protection circuit of claim 1, further comprising another resistive element coupling the gate to the source.

6. The electrostatic protection circuit of claim 1, the resistor p-well connected transistor comprising a resistor p-well connected NMOS transistor.

* * * * *